United States Patent [19]

Buesing et al.

[11] Patent Number: 4,730,749
[45] Date of Patent: Mar. 15, 1988

[54] SINGULATORY APPARATUS

[75] Inventors: Jonathan P. Buesing; James P. Buettner, both of St. Paul, Minn.

[73] Assignee: Micro Component Technology, Inc., St. Paul, Minn.

[21] Appl. No.: 778,415

[22] Filed: Sep. 20, 1985

[51] Int. Cl.[4] .............................................. B65G 59/00
[52] U.S. Cl. .................................... 221/123; 221/124; 221/131; 221/298; 221/301
[58] Field of Search ............... 221/289, 290, 294, 297, 221/298, 299, 301, 92, 123, 124, 131, 241, 251; 414/126, 125; 193/32, 40

[56] References Cited

U.S. PATENT DOCUMENTS

| | | | |
|---|---|---|---|
| 2,911,081 | 11/1959 | Dixon | 193/40 |
| 3,028,959 | 4/1962 | Clark et al. | 209/81 |
| 3,165,233 | 1/1965 | West | 221/241 X |
| 3,216,547 | 11/1965 | De Good et al. | 193/32 |
| 3,330,401 | 7/1967 | Ahlstedt | 198/26 |
| 3,508,680 | 4/1970 | Ewald, Jr. et al. | 221/301 X |
| 3,543,925 | 12/1970 | Loughery | 209/74 |
| 3,587,852 | 6/1971 | Kamm et al. | 209/748 |
| 3,662,881 | 5/1972 | Fineran | 209/73 |
| 3,727,757 | 4/1973 | Boissicat | 209/73 |
| 4,000,798 | 1/1977 | Cedrone | 193/40 |
| 4,058,223 | 11/1977 | Cruse | 214/1 BB |
| 4,149,641 | 4/1979 | DeVitz et al. | 414/126 |
| 4,222,166 | 9/1980 | Kurek et al. | 221/301 X |
| 4,234,418 | 11/1980 | Boissicat | 209/542 |
| 4,397,386 | 8/1983 | Kampf | 198/491 |

OTHER PUBLICATIONS

News release by Trigon Industries, Inc. entitled Chip Carrier Test Handlers, Jun. 1, 1984, 4 pages.

Primary Examiner—Joseph J. Rolla
Assistant Examiner—David H. Bollinger
Attorney, Agent, or Firm—Lawrence M. Nawrocki

[57] ABSTRACT

The device of this invention is an integrated circuit singulator apparatus comprised of several arm assemblies (14, 18, 34) which act in concert to isolate or singulate an individual integrated circuit for testing of the accuracy of the circuits therein. This integrated circuit handler can accommodate integrated circuits of varying dimensions. The various arm assemblies (14, 18, 34) act to control movement of the integrated circuit devices on a track (12) without damage occurring to the integrated circuit devices.

9 Claims, 4 Drawing Figures

SINGULATORY APPARATUS

TECHNICAL FIELD

The present invention is related generally to the field of apparatus for testing integrated circuit devices. More narrowly, the invention is directed to apparatus for feeding integrated circuit devices into such a tester. Specifically, the invention deals with an apparatus for isolating a single integrated circuit device for conveyence to a test site.

BACKGROUND OF THE INVENTION

Integrated circuit devices have numerous applications in industry. In many of these applications, it is necessary that the devices be accurate to a known degree. This necessitates the testing of each device before it enters the marketplace.

Various types of integrated circuit testers have been developed. Typically, these testers perform their function at a high rate of speed. Therefore, it is necessary to convey the devices for testing to and from the test site of the handler interfacing with the tester also at a high rate of speed. Additionally, since these testers typically test the devices one at a time, it is important that the devices be delivered to the test site singly. Delivery of more than one such device can jam the tester. This jamming of the devices at the test site has been a problem in the prior art.

Methods of singulation (that is, methods of isolating a single device from many of such devices on a track) have been developed in these circuit handlers to solve this problem. In order to prevent jamming, any singulation method employed should be simple and responsive to signals transmitted to the structure accomplishing the singulation.

The fragility of integrated circuits, be they of ceramic, plastic or other material, has been a problem in the prior art. There is a need to deliver these circuits to the tester without damage to the circuits.

Additionally, the variety of sizes of integrated circuits makes it advantageous to have circuit handlers that can easily adapt to varied sizes. This quick adjustability is a desirable feature.

Because it is preferrable to test the circuit devices at the same temperature as occurs at the place of their usage, heating and cooling mechanisms have been introduced at the test site. Additionally, heating and cooling mechanisms have been introduced into the vicinity of the circuit devices while they are retained within the circuit handler magazine.

In one prior art structure, multiple apparatuses for singulation have been used. This multiplicity of singulation devices corresponds in number to the number of tracks within the handler.

Each singulator arm assembly contains a solenoid for activation of a device upon receipt of an electrical signal from an optical sensor device. Because each of the singulator devices has a solenoid associated with it for activation of the device there associated, and because solenoids are susceptible to temperature change, this prior art structure is easily capable of malfunctioning.

It is desirable to have the solenoid actuator outside of the heating/cooling chamber. A single selector arm with the associated solenoid retained outside the heating/cooling chamber would be a desirable improvement.

Because of the rapid application of stress to the singulator apparatus, it is desirable to have a rigid structure to function as a frame and attachment base for the moving arms of the apparatus.

The present invention functions to overcome the problems of the prior art and to satisfy these requirements. It is an improved singulation apparatus for use in high speed integrated circuit device handlers.

SUMMARY OF THE INVENTION

The present invention is an apparatus for isolating or singulating integrated circuit devices for testing. It functions with respect to a track down which devices to be tested pass in moving to the test site at which the testing occurs. The invention includes a series of stops to control movement of the circuit devices down the track. Of this series of stops, the first stop, when engaged, prevents movement of the second from the lowermost circuit device in said track. The engagement of the first stop causes a responsive action disengaging a second stop, which, when engaged, prevents movement of the lowermost circuit device in said track. This responsive movement occurs only after engagement of the first stop. Disengagement of the second stop allows the device held by the second stop to proceed individually along said track. Also included in this apparatus are means for selectively urging said first stop to its engaged position.

In order to accommodate the fragility of the circuit devices being tested, means can be associated with the first stop which means comprise a spring loaded plunger to engage the circuit device without damaging it. This is accomplished by action of the spring to absorb much of the movement of the arm to which it is attached when the plunger moves toward the engaged position against and holding the circuit device. The spring loaded plunger also serves to allow downward movement of the actuator arm even after the circuit device has been engaged by the first stop.

In order to render a structure built in accordance with the invention as universal as possible, the first stop and the spring loaded plunger can be adjustably mounted on the carrying structure, an actuator arm for mounting the first stop. This spring loaded plunger is mounted for adjustability along an axis parallel to the track along which the circuit devices move. This adjustability allows accommodation for circuit devices of varied sizes within the singulator apparatus.

The second stop is mounted on a rocker arm. This stop in its normal, engaged position provides a barrier to movement of the circuits down the track. The rocker arm is activated by movement of the actuator arm, this movement communicated by a shoulder of the actuator. Said shoulder engages the rocker arm to pivot the rocker arm into a position disengaging its stop. If desired, the relative position of the shoulder can be adjusted with respect to the actuator arm so that the responsiveness of the rocker arm to movement of the actuator arm can be varied.

In one embodiment of the invention, the apparatus functions with respect to an inclined platen down which the circuit devices pass. On this inclined platen rests the track that aligns the circuit devices. Again a series of stops are arranged along the track to control the movement of the circuit devices along the track.

In a preferred embodiment of the invention, multiple tracks can be provided. In this embodiment, the tracks can be similarly dimensioned and disposed in a parallel fashion. When such a structure is employed, the multiple tracks can be integrated into a unitary assembly. A single selector arm can move laterally with respect to this series of tracks to selectively initiate movement of one of said actuator arm assemblies. Means for activating the selector arm can, therefore, be provided.

A rigid structure by which inter-attachment of the arm assemblies can be accomplished may consist of a tri-bar assembly. This structure would provide means of attaching and pivotably mounting the actuator arm and the rocker arm assemblies. The rocker arm assembly would pivot around one shaft of this tri-bar assembly when activated by the shoulder of the actuator arm assembly, and the actuator arm assembly would also pivot around a separate shaft of the assembly when activated by the selector arm. This assembly would afford stability to the structure and rigidly define the normal positions of the actuator and rocker arm assemblies. The tri-bar assembly would provide a rigid base around which these arms move, allowing for uniform positioning of the arms in their engaged or disengaged positions. The shafts of the tri-bar asembly can be integrated into a unitary assembly, thus providing a sturdy base.

The preferred embodiment also utilizes a spring carried by the rocker arm assembly for retaining the rocker arm in its normal, stop engaged, position when the rocker arm is not activated by the shoulder of the actuator arm. When the rocker arm is engaged by the shoulder of the actuator arm, the rocker arm pivots on its mounting shaft of the tri-bar assembly and raises the second stop, thereby allowing the circuit device previously retained to continue along the track.

In the preferred embodiment, the selector arm would activate the actuator arm by depressing the actuator arm. Means would be provided to the invention to position the selector arm relative to one of a plurality of the actuator arm/rocker arm assemblies.

In the preferred embodiment, the actuator arm is activated by rotation of the selector arm downwardly to engage the actuator arm. This rotation of the selector arm can be accomplished by rotation of a square shaft to which the selector arm is mounted and by which it is positioned above the actuator arm/rocker arm assemblies. However, any appropriate mechanism for rotating the selector arm could be used.

The present invention is thus an improved structure for overcoming problems of the prior art and for efficiently accomplishing the intended goal of singulating circuit devices for testing. More specific features of the device and advantages obtained in view of those features will become apparent with reference to the DETAILED DESCRIPTION OF THE INVENTION portion of this document, the appended claims, and the accompanying drawings.

DETAILED DESCRIPTION OF THE INVENTION

Figure 1:
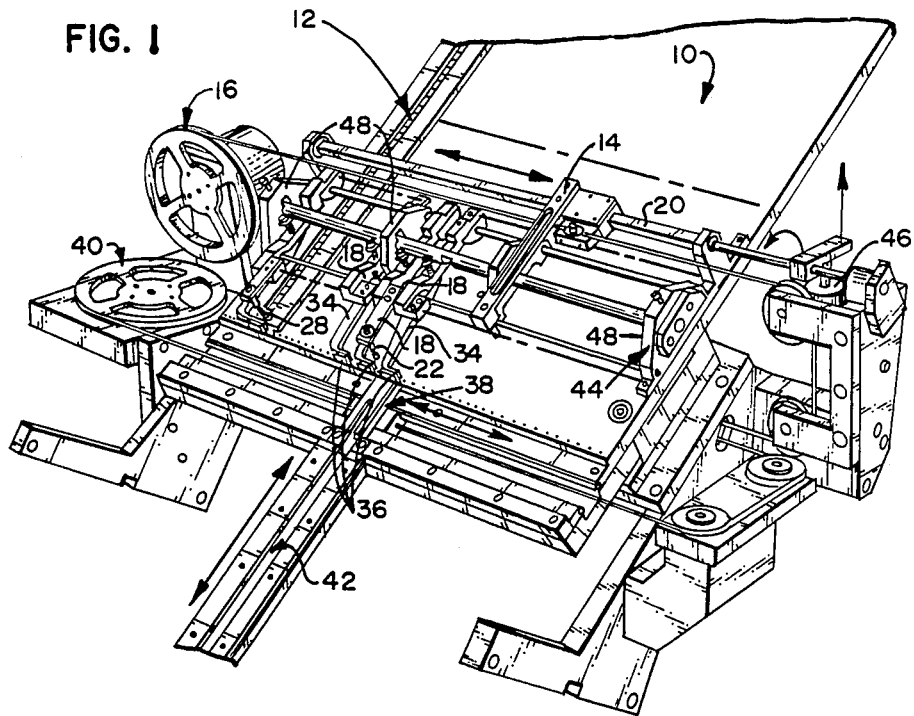
FIG. 1 is a perspective view of the apparatus in accordance with the present invention.

Referring now to the figures wherein like reference numerals denote like elements throughout the several views, FIG. 1 illustrates a singulator apparatus in accordance with the present invention. Shown is an inclined platen 10 with a single track 12 for singulation of integrated circuit devices. It will be understood, however, that a plurality of such tracks could, and invariably would, be included. This track, mounted on the inclined platen, allows gravitational forces to effect movement of integrated circuit devices downwardly therealong.

Also shown in FIG. 1 are a series of arm assemblies which can be positioned one above each track for effecting singulation. A single selector arm 14, shown in the drawing as positionable by cable drive means 16, initiates the action of the arm assemblies. The selector arm 14 effects singulation of the circuit devices by being positioned above a selected actuator arm 18 and downwardly engaging that actuator arm. The selector arm 14 rotates downwardly to engage the actuator arm 18 when a square shaft 20 to which it is mounted is made to rotate. The square shaft 20 can be activated by a number of mechanisms.

In the preferred embodiment, the selected actuator arm 18 rotates downwardly when engaged by the selector arm 14. The actuator arm 18, carrying a spring loaded plunger 22, causes a corresponding downward movement of the plunger 24. This movement effects engagement of the plunger 24 with an integrated circuit device 26, second lowermost in a string of devices routed along the track therebeneath. The plunger 24 thereby defines a first stop.

Because of the spring loading of the plunger, it can engage the integrated circuit and arrest its movement, while, at the same time, absorb movement of the actuator arm 18 to allow for engagement of the integrated circuit 26 without damage thereto. The spring 28 also allows the actuator arm 18 to move beyond the point of initial engagement of the circuit device. This is an accommodation feature allowing circuit devices of varying thicknesses to be handled by this apparatus.

The spring loaded plunger 22 is retained on the actuator arm 18 by means of an adjustable collar 30. This collar 30 allows for positioning of the spring loaded plunger 22 longitudinally and parallel with respect to the underlying path to accommodate circuit devices of varying sizes that are to be singulated by this apparatus.

In addition to carrying the spring loaded plunger 22, the actuator arm 18 also carries a shoulder 32 for engagement of the rocker arm assembly. Downward movement of the actuator arm thereby translates to a downward movement of the shoulder 32. The shoulder 32 engages the rocker arm 34 and causes the rocker arm to pivot and raise an obstruction element. This element defines a second stop 36.

As seen in the figures, the shoulder 32 can comprise an externally threaded screw received in an internally threaded aperture formed in the actuator arm 18. The shoulder 32, relative to the actuator arm 18, can, thereby, be adjusted. As the shoulder 32 is made to be spaced farther from the underside of the actuator arm 18, it will initiate pivoting of the rocker arm 34 with only small movement of the actuator arm 18. The rocker arm 34 can, thereby, be made more responsive (or, in the case of retracting the screw, less responsive) to movement of the actuator arm 18.

The normal position for the second stop 36 is an engaged position. In this engaged position, the second stop 36 provides a barrier on the underlying track barring continued movement of circuit devices 26 positioned on that track. Engagement and pivoting of the rocker arm 34 retracts the second stop 36 allowing passage of circuit devices 26 therebeneath. Because the rocker arm 34 is not engaged by the shoulder 32 until after the plunger engages the second lowermost integrated circuit, however, the second stop 36 does not allow passage of a circuit device until the first stop 24 is engaged. Retraction of the second stop 36 effects release of an individual circuit device for further conveyance and eventual movement down a chute to a test site.

Also shown in FIG. 1 is a laterally positionable shuttle 38 which funtions to accept the released circuit device and transfer it for deposit at a test site for testing. The shuttle 38 shown is operated by a cable drive means 40. The shuttle 38 carries the circuit devices to a chute 42 which feeds the devices into the test site. The test site is not shown.

It will be understood that the limited number of actuator arm/rocker arms assembles shown in FIG. 1 is merely for purposes of illustration. In the preferred embodiment, there is an actuator arm assembly and a rocker arm assembly for each track mounted on the inclined platen.

Additionally, heating and cooling chambers can be incorporated into the system. These heating and cooling chambers (not shown) can allow for the manipulation of the temperature of the circuit devices while in the handler. This is advantageous because circuit devices are preferably tested at the temperature at which they will be used.

The use of a single selector arm 14 in this apparatus enables a temperature sensitive solenoid 46, which initiates actuation of the selector arm 14, to be retained outside the temperature chamber of the system. This prevents any temperature change applied to the circuit devices from affecting the solenoid and causing a malfunction within the selector arm assembly.

Figure 4:
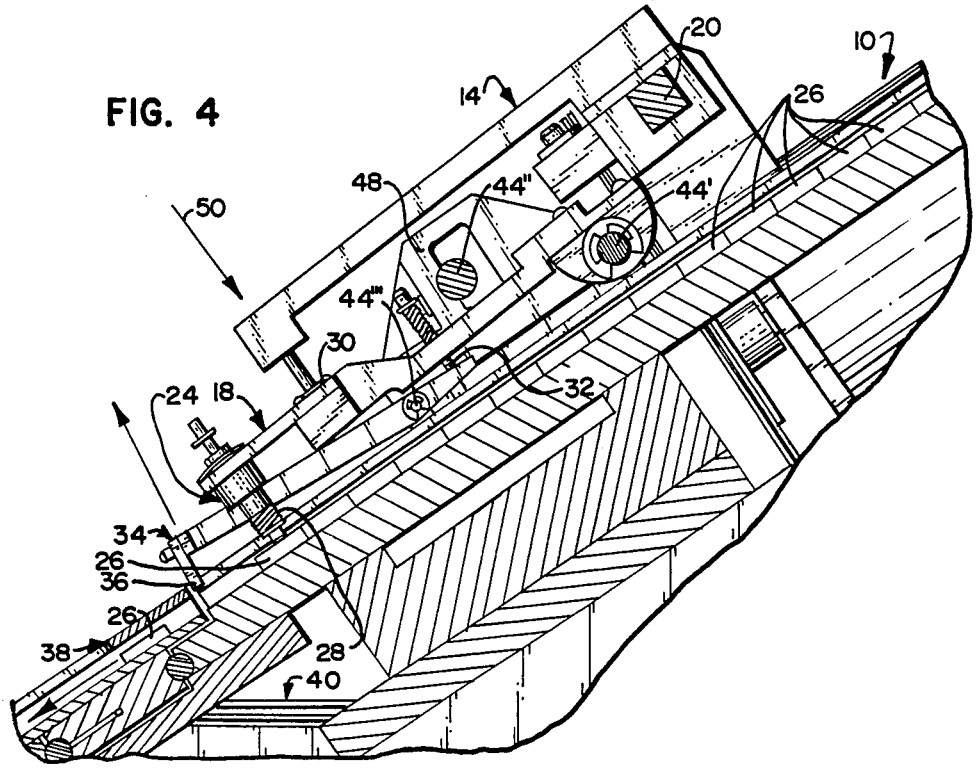
FIG. 4 is an enlarged view, similar to that of FIGS. 2 and 3, of the actuator arm/rocker arm assembly, showing the selector arm having activated the actuator arm to engage the first stop, the shoulder of the actuator arm having activated the rocker arm to disengage the second stop and allow movement of the lowermost circuit device along the track.
Figure 2:
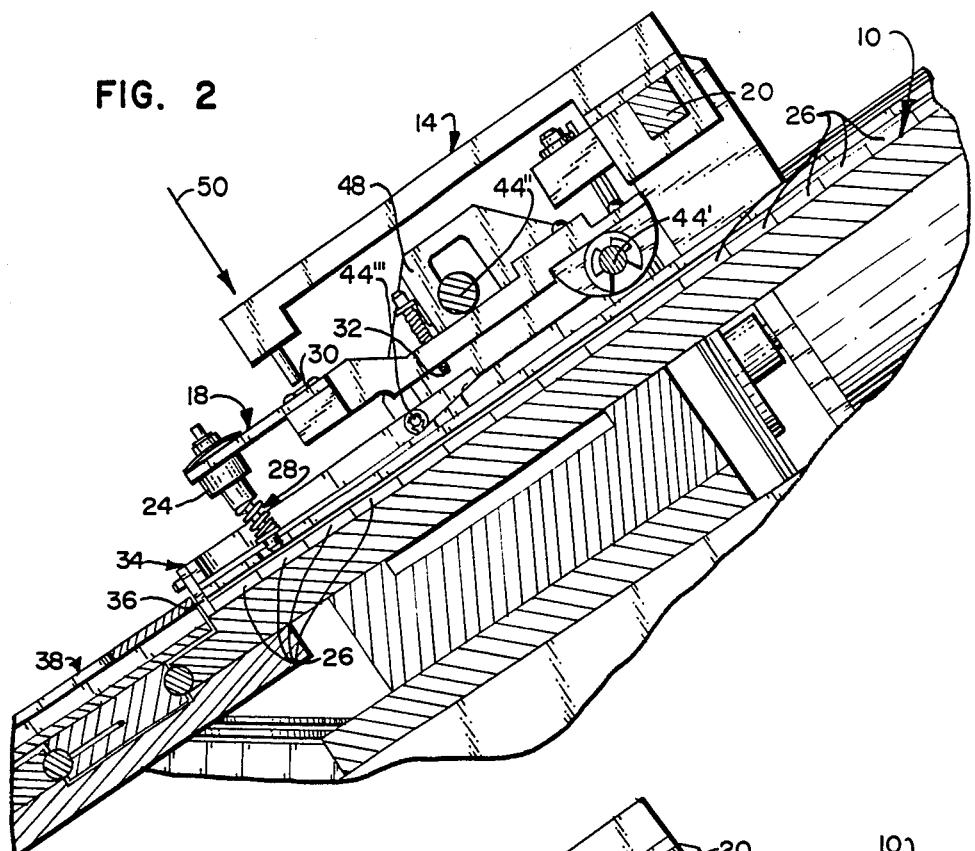
FIG. 2 is an enlarged view of an actuator arm/rocker arm assembly of the apparatus showing the selector arm in the unengaged position, the actuator arm in the unengaged position with the first stop retracted, and the rocker arm in the engaged position with the second stop engaged preventing passage of circuit devices along the track.
Figure 3:
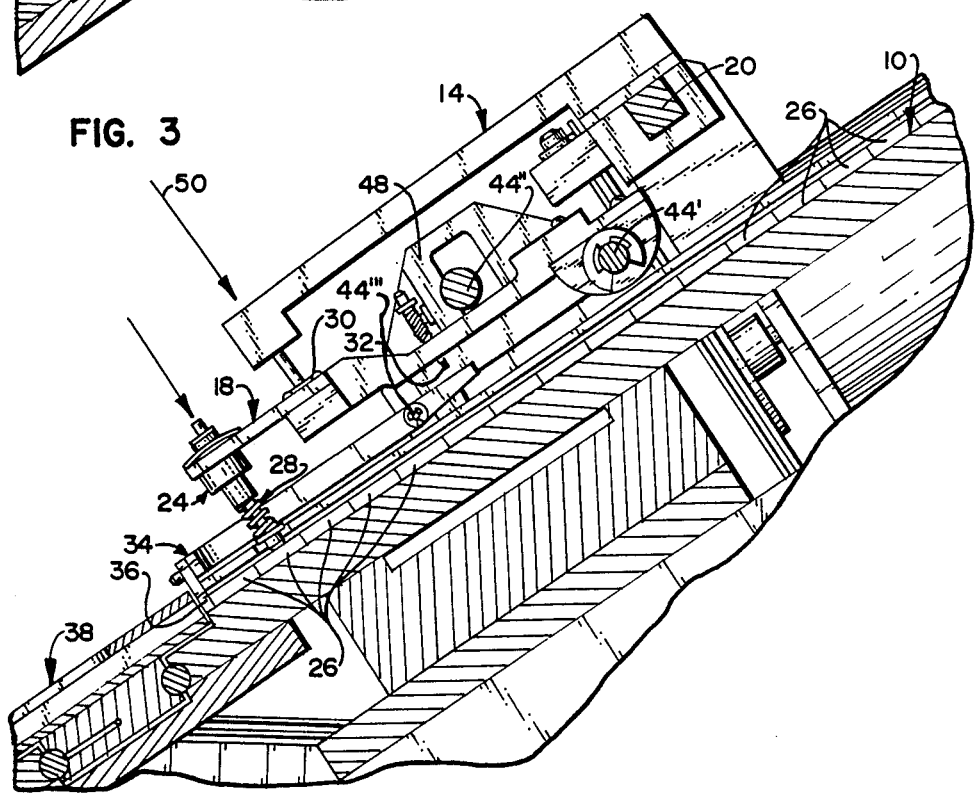
FIG. 3 is an enlarged view, similar to that of FIG. 2, of the actuator arm/rocker arm assembly showing activation of the selector arm which in turn has activated the actuator arm to engage the first stop.

The various arm assemblies are shown in more detail in FIGS. 2, 3 and 4. It will be understood that, in an operational handler, the actuator arm/rocker arm assemblies will be spaced at equal distances substantially across the full width of the platen. Other methods of arranging the various arm assemblies in this apparatus are, however, possible.

FIGS. 2, 3 and 4 show an individual arm assembly of which there can be many on this apparatus. FIG. 2 shows the selector arm 14 positioned above the actuator arm 18. However, the selector arm 14 is not shown engaging the actuator arm 18. Therefore, the first stop 24 carried by the actuator arm 18 is in its retracted or normal position and the shoulder 32 of the actuator arm is not engaging the rocker arm 34. The stop carried by the rocker arm, therefore, is in its normal or engaged position obstructing the flow of the circuit devices along the individual track shown.

FIG. 3 shows the selector arm 14 in position activating the actuator arm 18. The arrow 50 indicates the application of force to the end of the selector arm 14 opposite its mounting point.

As previously discussed, activation of the actuator arm 18 and engagement of the first stop 24 with the second lowermost circuit device causes a responsive action in the rocker arm assembly 34. The shoulder 32 of the actuator arm 18 engages that end of the rocker arm opposite the end carrying the stop, causing the rocker arm to pivot around a shaft 44''' of a tri-bar assembly 44. In FIG. 3, although activation of the actuator arm 18 and first stop 24 carried thereby to effect engagement of the stop with a circuit device has taken place, the rocker arm 34 is just beginning to be activated, the shoulder 32 carried by the actuator just coming into contact with the rocker arm 34.

FIG. 4 reflects positioning as a result of the continuation of this motion. The shoulder 32 of the actuator arm has pivoted the rocker arm 34 to retract and disengage the second stop 36. With this action completed, the first stop 24 still retains the second lowermost circuit device in the string of devices and all devices thereabove. The lowermost circuit device is, however, released by retraction of the second stop 36. This lowermost circuit device is now free to travel down the track, into the shuttle 38, and eventually to a test site.

The tri-bar assembly 44, also shown in FIG. 1, consists of a plurality of shafts 44', 44'', 44''' that provide structural rigidity and shafts 44', 44''' for the actuator arm 18 and rocker arm 34 to pivot about. FIG. 1 shows perspectively this tri-bar assembly. FIGS. 2, 3 and 4 indicate a cross section of this tri-bar assembly 44', 44'', 44''' showing the pivotal mounting of the various arms to the separate shafts of the tri-bar assembly.

Shaft 44'', while functioning to provide structural rigidity and integrity to the pivotal shafts 44', 44''' with respect to which the actuator arm 18 and rocker arm 34, respectively, rotate, also functions as an upper limit stop to govern maximum upward movement of the actuator arm 18. When the selector arm 14 has not initiated downward movement of a particular actuator arm 18, an upper surface of the arm 18 will be in engagement with the shaft 44''.

Means (not shown) can be provided for adjusting the location of the shaft 44'' relative to support panels 48. As can be seen, when the shaft 44'' is adjusted in a direction either toward or away from the actuator arm 18, the normal position of the plunger 24 will be concurrently varied. Integrated circuit devices of various sizes can, thereby, be accommodated in passing down the inclined platen 10. If a device of a greater thickness is to be received on the platen 10, the shaft 44'' merely need be adjusted upward away from the platen 10, and the arm 18 along with the plunger 24 it carries will be retracted with respect to the platen 10 so that the thicker device can be accommodated.

Numerous characteristics and advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. An apparatus for handling and singulating integrated circuit devices for testing and sorting, comprising:
   (a) a track for carrying integrated circuit devices;
   (b) first and second stops arranged along said track for controlling the progress of the circuit devices along said track;
   (c) an actuator arm for carrying said first stop, said actuator arm being pivotally mounted to move said first stop between one of two positiions, the first an engaged position preventing movement of circuit devices along said track and the second a normal, retracted position allowing movement of the devices along said track, said actuator arm carrying a shoulder;
   (d) a rocker arm for carrying said second stop, said rocker arm being pivotally mounted to move said second stop between one of two positions, the first a normal position preventing movement of circuit devices along said track and the second a retracted position allowing movement of the devices along said track, said rocker arm having an abutment engageable by said shoulder of said actuator arm;
   (e) means for pivoting said actuator arm to urge said first stop to its first position to prevent movement of the second lowermost circuit device on said track; and
   (g) wherein, as said actuator arm is pivoted to urge said first stop to its first position, said shoulder engages said abutment to pivot said rocker arm to a position wherein said second stop is in its second position to allow movement of the lower most circuit along said track.

2. The apparatus as defined in claim 1, wherein said first stop further comprises a spring loaded plunger to contact a circuit device on said track, when in its engaged position, to stop the progress of the circuit along said track.

3. The apparatus as defined in claim 2, wherein said actuator arm further comprises means for adjusting the positioning of said plunger along an axis parallel to movement of devices along said track.

4. The apparatus as defined in claim 1, wherein said first stop is engaged prior to the retraction of said second stop.

5. Apparatus for singulating integrated circuit devices and conveying them to an electronic testing and sorting area, comprising:
   (a) an inclined platen down which the circuit devices pass;
   (b) a plurality of tracks, spaced laterally along said platen, for aligning circuit devices on said platen;
   (c) a first and a second stop arraanged along each of said tracks for controlling the movement of circuit devices along said tracks;
   (d) a gang of actuator arm assemblies, each of said gang associated with one of said tracks and mounting a corresponding first of said stops to actuably engage a second lowermost device to prevent passage of said device and all devices thereabove along the track with which the actuator arm is associated;
   (e) a gang of rocker arm assemblies, each of said rocker arm assemblies being associated with one of said tracks and that track's associated actuator arm assembly, and each of said rocker arm assemblies mounting a corresponding second of said stops and being responsive to movement of an associated actuator arm assembly when it is pivoted to engage its corresponding first stop with a second lowermost device in the associated track, wherein said corresponding second stop retracts to allow passage of a lowermost circuit device along the associated track;
   (f) a selector arm moveable laterally with respect to said gang of actuator arm assemblies to selectively initiate movement of one of said actuator arm assemblies; and
   (g) means for longitudinally adjusting the position of each of said first stops relative to its corresponding second stop to accommodate circuit devices of various sizes.

6. The apparatus as defined in claim 5, further comprising means for activating said selector arm.

7. An apparatus for singulating integrated circuit devices and conveying them to an electronic testing and sorting area, comprising:
   (a) an inclined platen down which the circuit devices pass;
   (b) track means for aligning circuit devices on said inclined platen;
   (c) first and second stops arranged along said track means for controlling the movement of the circuit devices along said track means;
   (d) an actuator arm assembly mounting said first stop to actuably engage a second lowermost device to prevent passage of said device and all devices thereabove along said track means, said actuator arm assembly further comprising a shoulder;
   (e) a rocker arm assembly, mounting said second stop, said rocker arm assembly being responsive to engagement thereof by said shoulder as said actuator arm assembly moves to effect engagement of said first stop with the second lowermost device, wherein said rocker arm assembly is pivoted to effect retraction of said second stop to allow passage of a lowermost circuit device along said track means;
   (f) a plurality of parallel shafts, said actuator arm assembly and said rocker arm assembly being pivotably mounted by a different one of said parallel shafts; and
   (g) means for longitudinally adjusting the positioning of said first stop relative to said second stop to accomodate circuit devices of varied sizes.

8. The apparatus as defined in claim 7, wherein said rocker arm pivots around one shaft of said plurality of parallel shafts when activated by said shoulder of said actuator arm assembly.

9. The apparatus as defined in claim 7, wherein activation of said rocker arm by said shoulder of actuator arm causes said rocker arm to pivot upon one of said plurality of shafts to raise said second stop and allow the circuit device previously retained to continue along said track.

* * * * *